United States Patent
Wu

(10) Patent No.: US 9,615,460 B2
(45) Date of Patent: Apr. 4, 2017

(54) CIRCUIT BOARD DEVICE AND CIRCUIT BOARD DEVICE FOR REDUCING ACOUSTIC NOISE

(71) Applicant: Wistron NeWeb Corp., Hsinchu (TW)

(72) Inventor: Chia-Hsin Wu, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 70 days.

(21) Appl. No.: 14/724,378

(22) Filed: May 28, 2015

(65) Prior Publication Data

US 2016/0007443 A1    Jan. 7, 2016

(30) Foreign Application Priority Data

Jul. 2, 2014 (TW) .............................. 103122802 A

(51) Int. Cl.
| H05K 7/10 | (2006.01) |
| H05K 7/12 | (2006.01) |
| H05K 1/18 | (2006.01) |
| H05K 1/02 | (2006.01) |

(52) U.S. Cl.
CPC ........... *H05K 1/181* (2013.01); *H05K 1/0231* (2013.01); *H05K 2201/09072* (2013.01); *H05K 2201/10015* (2013.01); *H05K 2201/10545* (2013.01); *Y02P 70/611* (2015.11)

(58) Field of Classification Search
USPC .......................................... 361/767; 174/260
See application file for complete search history.

(56) References Cited

U.S. PATENT DOCUMENTS 6,304,425 B1 * 10/2001 Mamada ................ H05K 1/181
361/320

FOREIGN PATENT DOCUMENTS

JP        2011159961 A        8/2011

* cited by examiner

*Primary Examiner* — Andargie M Aychillhum
(74) *Attorney, Agent, or Firm* — Muncy, Geissler, Olds & Lowe, P.C.

(57) ABSTRACT

A circuit board device for reducing acoustic noise is provided. The circuit board device includes a substrate, a first capacitor packaging area, a second capacitor packaging area, a first pad, a second pad, a third pad and a fourth pad. The first and second capacitor packaging areas are respectively disposed on a first side and a second side of the substrate in a back-to-back manner. The first and second pads are disposed in the first capacitor packaging area for mounting a first capacitor. The third and fourth pads are disposed in the second capacitor packaging area for mounting a second capacitor, wherein the first and third pads are set back-to-back and electrically connected to each other, and the second and fourth pads are set back-to-back and electrically connected to each other.

6 Claims, 3 Drawing Sheets

US 9,615,460 B2

CIRCUIT BOARD DEVICE AND CIRCUIT BOARD DEVICE FOR REDUCING ACOUSTIC NOISE

CROSS REFERENCE TO RELATED APPLICATIONS

This Application claims priority of Taiwan Patent Application No. 103122802, filed on Jul. 2, 2014, the entirety of which is incorporated by reference herein.

BACKGROUND OF THE INVENTION

Field of the Invention

The disclosure relates to a circuit board device, and more particularly to a circuit board device for reducing acoustic noise.

Description of the Related Art

The multilayer ceramic capacitor (MLCC) has the characteristics of small size, cheap price and good frequency performance. The multilayer ceramic capacitor is a surface mount component. The multilayer ceramic capacitor can be quickly produced in large numbers and reduce the space used on the printed circuit board. The multilayer ceramic capacitor is currently applied in portable electronic products such as notebooks. Because the ripple noise in the circuit board makes the structures of the multilayer ceramic capacitor vibrate, the micro-phony phenomenon (high-frequency micro-phony phenomenon) occurs thereby. When a user uses an electronic product equipped with multilayer ceramic capacitors, the user may hear the acoustic noise produced by the multilayer ceramic capacitors. Therefore the present disclosure provides a new circuit board device to resolve the above problem.

BRIEF SUMMARY OF THE INVENTION

A detailed description is given in the following embodiments with reference to the accompanying drawings.

An embodiment of the present disclosure provides a circuit board device for reducing acoustic noise. The circuit board device includes a substrate, a first capacitor packaging area, a second capacitor packaging area, a first pad, a second pad, a third pad and a fourth pad. The first and second capacitor packaging areas are respectively disposed on a first side and a second side of the substrate in a back-to-back manner. The first and second pads are disposed in the first capacitor packaging area for mounting a first capacitor. The third and fourth pads are disposed in the second capacitor packaging area for mounting a second capacitor, wherein the first and third pads are set back-to-back and electrically connected to each other, and the second and fourth pads are set back-to-back and electrically connected to each other.

An embodiment of the present disclosure provides a circuit device for reducing acoustic noise. The circuit device includes a circuit board device, a driving circuit, a load circuit and a conduction path. The circuit board device includes a substrate, a first capacitor packaging area, a second capacitor packaging area, a first pad, a second pad, a third pad and a fourth pad. The first and second capacitor packaging areas are respectively disposed on a first side and a second side of the substrate in a back-to-back manner. The first and second pads are disposed in the first capacitor packaging area for mounting a first capacitor. The third and fourth pads are disposed in the second capacitor packaging area for mounting a second capacitor, wherein the first and third pads are set back-to-back and electrically connected to each other, and the second and fourth pads are set back-to-back and electrically connected to each other. The driving circuit is disposed on the circuit board device. The load circuit is disposed on the circuit board device. The conduction path is coupled to the driving circuit and the load circuit, and electrically connected to the first and third pads.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the present disclosure. This description is made for the purpose of illustrating the general principles of the present disclosure and should not be taken in a limiting sense. The scope of the present disclosure is best determined by reference to the appended claims.

Because the dielectric material of the multilayer ceramic capacitor is mainly made of barium titanate (BaTiO), the multilayer ceramic has the piezoelectric characteristics. In an alternating electric field, the ripple noise on the power path causes the dielectric material of the multilayer ceramic capacitor to expand and contract along the electric field's direction. The surface of the multilayer ceramic capacitor is pushed off or pulled to the center of the multilayer ceramic capacitor. It leads the outer electrode of the multilayer ceramic capacitor to become tilted and the shrinkage in the horizontal direction of the substrate surface. It causes the structure of the multilayer ceramic capacitor to vibrate and then the micro-phony phenomenon occurs. Additionally, the friction between the structure of the multilayer ceramic capacitor and the circuit board substrate also produces acoustic noise.

Using a Wi-Fi router complying with the IEEE 802.11b standard as example, the vibration frequency of the structure of the multilayer ceramic capacitor disposed in the Wi-Fi router is 0.48 kHz when the transmission rate of the Wi-Fi router is 5.6 Mbit/s. Using a Wi-Fi router complying with the IEEE 802.11a/g standard as example, the vibration frequency of the structure of the multilayer ceramic capacitor disposed in the Wi-Fi router is 2.3 kHz when the transmission rate of the Wi-Fi router is 27 Mbit/s. Using a standard Wi-Fi router complying with the IEEE 802.11n standard as example, the vibration frequency of the structure of the multilayer ceramic capacitor disposed in the Wi-Fi router is 4.0 kHz when the transmission rate of the Wi-Fi router is 300 Mbit/s. In general, the frequency range of human hearing is about 20 Hz-20 kHz. Therefore people can hear the microphony phenomenon caused by the multilayer ceramic capacitors in the Wi-Fi router. In order to reduce the microphony phenomenon, the disclosure provides an embodiment of arranging multilayer ceramic capacitors in a circuit board.

Figure 1A:
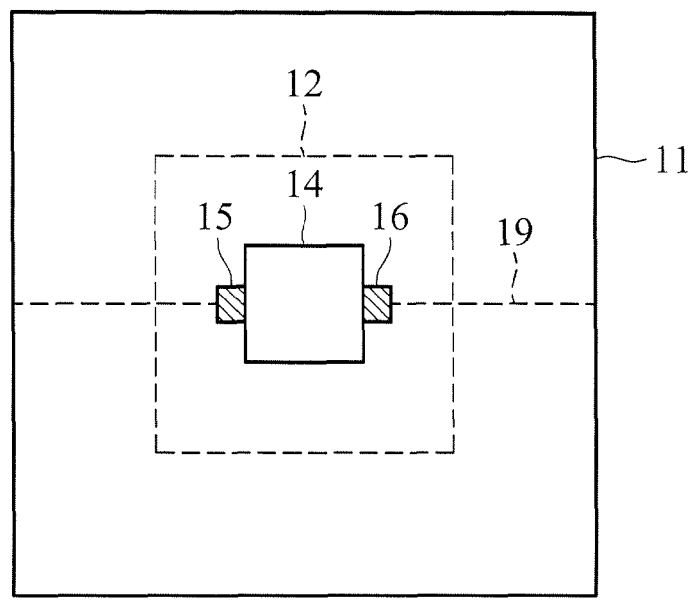
FIG. 1A shows a top view of an obverse side (a first plane) of a circuit board device 10 according to an embodiment of the present disclosure.

FIG. 1A shows a top view of an obverse side (a first plane) of a circuit board device 10 according to an embodiment of the present disclosure. In this embodiment, the circuit board device 10 uses a substrate 11 as a base. A first capacitor packaging area 12, an opening 14, a first pad 15 and a second pad 16 are arranged on the obverse side (the first plane) of the circuit board device 10. The opening 14, the first pad 15 and the second pad 16 are disposed in the first capacitor packaging area 12. The opening 14 is set between the first pad 15 and the second pad 16. The first pad 15 and the second pad 16 are used to install (mount) a first capacitor 21 (not shown in FIG. 1A).

Figure 1B:
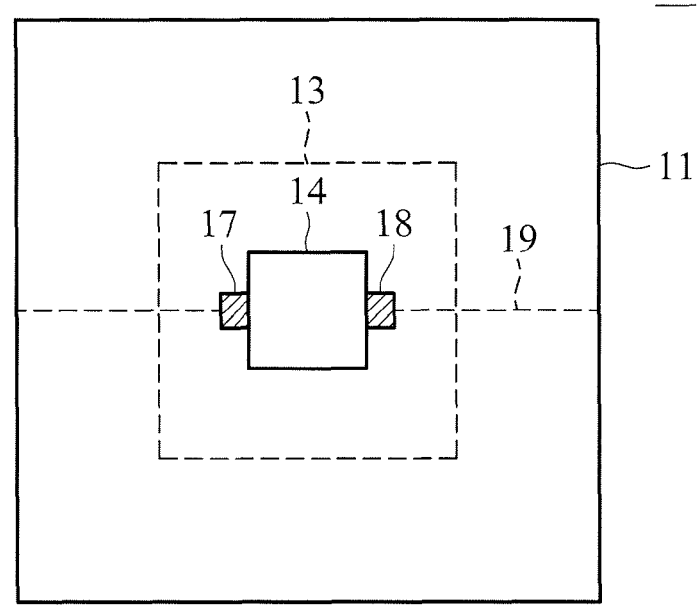
FIG. 1B shows a top view of a reverse side (a second plane) of the circuit board device 10 according to an embodiment of the present disclosure.

FIG. 1B shows a top view of a reverse side (a second plane) of the circuit board device 10 according to the embodiment of the present disclosure. In this embodiment, the circuit board device 10 uses the substrate 11 as a base. A second capacitor packaging area 13, the opening 14, a third pad 17 and a fourth pad 18 are arranged on the opposite side (the second plane) of the circuit board device 10. The opening 14, the third pad 17 and the fourth pad 18 are disposed on the second capacitor packaging area 13. The opening 14 set between the third pad 17 and the fourth pad 18 passes through the first capacitor packaging area 12 and the second capacitor packaging area 13. The third pad 17 and the fourth pad 18 are used to install a second capacitor 22 (not shown in FIG. 1B).

Figure 2:
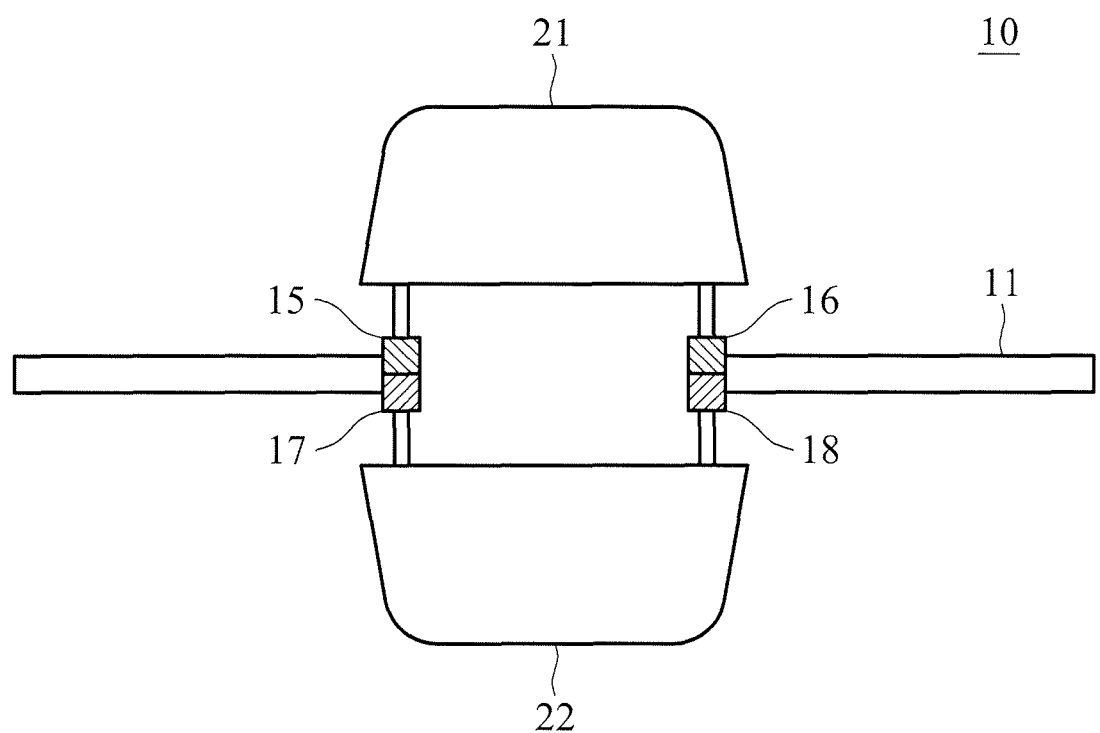
FIG. 2 shows a cross section view of the circuit board device 10 along the dashed line 19 shown in FIG. 1A and FIG. 1B.

FIG. 2 shows a cross section view of the circuit board device 10 along the dashed line 19 shown in FIG. 1A and FIG. 1B. In this embodiment, the first pad 15 and the third pad 17 are disposed back-to-back (aligned with each other) and electrically connected to each other. Similarly, the second pad 16 and the fourth pad 18 are disposed back-to-back (aligned with each other) and electrically connected to each other. The first capacitor 21 is mounted on the first pad 15 and the second pad 16. The second capacitor 22 is soldered on the third pad 17 and the fourth pad 18.

In the embodiment of FIG. 2, the first capacitor 21 and the second capacitor 22 are both multilayer ceramic capacitors. The size of the first capacitor 21 is the same as the size of the second capacitor 22. The first capacitor 21 and the second capacitor 22 also have equal capacitance. The first capacitor 21 is soldered on the first pad 15 and the second pad 16, and the second capacitor 22 is soldered on the third pad 17 and the fourth pad 18. When the first capacitor 21 and the second capacitor 22 are used as the output load of a load circuit, the ripple noise on the power path respectively produces a first force on the first capacitor 21 and a second force on the second capacitor 22. The first and second forces are equal while choosing two identical capacitors as the first capacitor 21 and the second capacitor 22. Because the arrangement of the first capacitor 21 and the second capacitor 22 are opposite, the directions of the first and second forces are opposite, too. Hence the first and second forces mutually counteract. As a result, the micro-phony phenomenon caused by the multilayer ceramic capacitors can be significantly reduced. When the first capacitor 21 and the second capacitor 22 vibrate due to the micro-phony phenomenon, the friction between the first capacitor 21, the second capacitor 22 and the substrate 11 produces acoustic noise. In view of this, the opening 14 is used to reduce the possible contact area between the first capacitor 21, the second capacitor 22 and the substrate 11. In another embodiment, widening the separation of the first capacitor 21 and the second capacitor 22 with respect to the substrate 11 can also reduce the possible contact area between the first capacitor 21, the second capacitor 22 and the substrate 11.

Figure 3A:
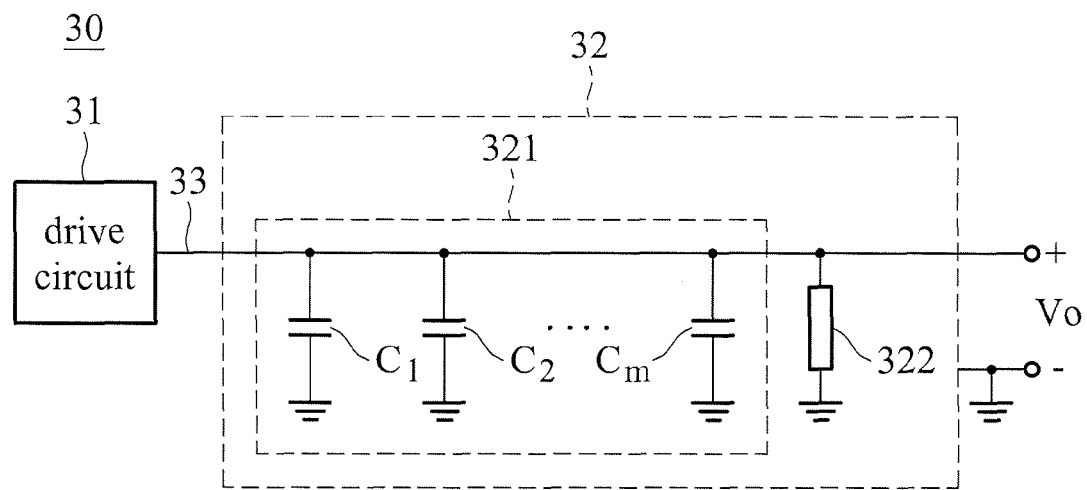
FIG. 3A shows a block diagram of a circuit device 30 according to an embodiment of the present disclosure.

FIG. 3A shows a block diagram of a circuit device 30 according to an embodiment of the present disclosure. The circuit device 30 includes a driving circuit 31, a load circuit 32 and a conduction path 33. The circuit device 30 can be the motherboard of a notebook, a wireless communication chip of a phone or a circuit board of the Wi-Fi router, but it is not limited thereto. The circuit board device needed to configure the multilayer ceramic capacitors is not out of the scope of the present disclosure. In this embodiment, the driving circuit 31, the load circuit 32 and the conduction path 33 are all disposed on a circuit board device (i.e. disposed on the circuit board device 10 shown in FIG. 1A). The driving circuit 31 can be a driver integrated circuit (IC). The load circuit 32 is used as the output load of the driving circuit 31. The conduction path 33 is electrically connected to the driving circuit 31 and the load circuit 32. The load circuit 32 comprises a capacitor load 321 and a load 322. The capacitor load 321 comprises a plurality of multilayer ceramic capacitors $C_1, C_2 \ldots C_m$. The load 322 comprises resistors, inductors or the transistors which are used as an active load. As described above, the ripple noise on the conduction path 33 may cause the multilayer ceramic capacitors $C_1, C_2 \ldots C_m$ to vibrate and then the micro-phony phenomenon to occur, if the arrangement of the disclosure is not used.

Figure 3B:
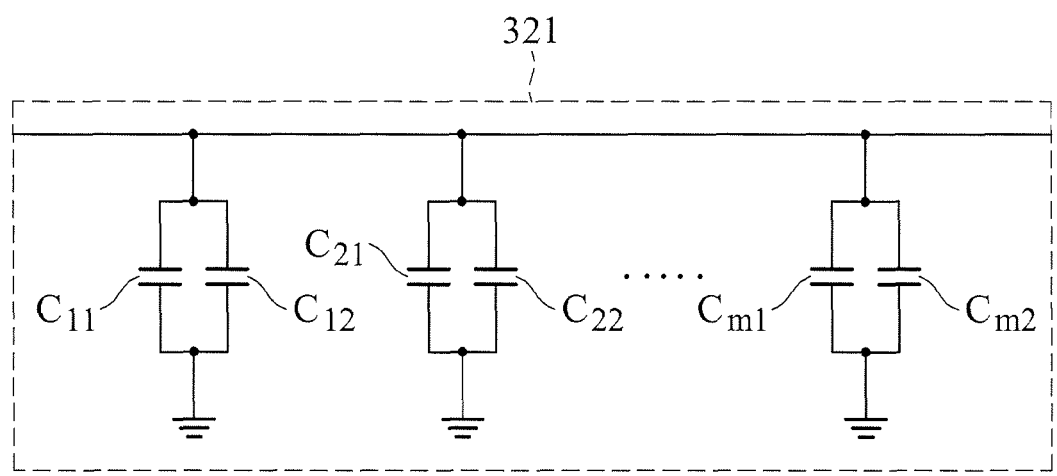
FIG. 3B shows a circuit diagram of a capacitor load 321 according to an embodiment of the present disclosure.

FIG. 3B shows a circuit diagram of a capacitor load 321 according to an embodiment of the present disclosure. As shown in FIG. 3B, the present disclosure provides an embodiment of another configuration structure of the capacitor load 321 for reducing the micro-phony phenomenon caused by the multilayer ceramic capacitors $C_1, C_2 \ldots C_m$. In this embodiment, the multilayer ceramic capacitor $C_1$ is composed by connecting in parallel a first multilayer ceramic capacitor $C_{11}$ and a second multilayer ceramic capacitor $C_{12}$, wherein the configuration of the first multilayer ceramic capacitor $C_{11}$ and the second multilayer ceramic capacitor $C_{12}$ is the same as the configuration of the first and second capacitor 21 and 22 shown in FIG. 2. The first multilayer ceramic capacitor $C_{11}$ and the second multilayer ceramic capacitor $C_{12}$ are identical, and the capacitance of the first multilayer ceramic capacitor $C_{11}$ and the second multilayer ceramic capacitor $C_{12}$ are both half of the capacitance of the multilayer ceramic capacitor $C_1$. For example, if the capacitance of the multilayer ceramic capacitor $C_1$ is 0.01 μF, then the capacitance of the first multilayer ceramic capacitor $C_{11}$ and the second multilayer ceramic capacitor $C_{12}$ are both 0.005 μF.

In the embodiment of FIG. 3B, the conduction path 33 is electrically connected to the first pad 15 and the third pad 17, and the second pad 16 and the third pad 17 are connected to ground, wherein the first pad 15 and the second pad 16 are used for mounting the first multilayer ceramic capacitor $C_{11}$, and the third pad 17 and the fourth pad 18 are used for mounting the second multilayer ceramic capacitor $C_{12}$. In the same way, the multilayer ceramic capacitor $C_2$ is composed by connecting in parallel a first multilayer ceramic capacitor $C_{21}$ and a second multilayer ceramic capacitor $C_{22}$, and the multilayer ceramic capacitor $C_m$ is composed by connecting in parallel a first multilayer ceramic capacitor $C_{m1}$ and a second multilayer ceramic capacitor $C_{m2}$. The configurations of the first multilayer ceramic capacitors $C_{21}$, $C_{m1}$ and the second multilayer ceramic capacitors $C_{22}$, $C_{m2}$ are the same as the configuration of the first and second capacitors 21 and 22 shown in FIG. 2. When the micro-phony phenomenon occurs, the vibration produced by the first multilayer ceramic capacitors $C_{11}$, $C_{21}$~$C_{m1}$ and the second multilayer ceramic capacitors $C_{12}$, $C_{22}$~$C_{m2}$ mutually counteract. Compared with the capacitor load 321 shown in FIG. 3A, the capacitor load 321 shown in FIG. 3B produces less acoustic noise.

While the present disclosure has been described by way of example and in terms of preferred embodiment, it should be understood that the present disclosure is not limited thereto. On the contrary, it is intended to cover various modifications and similar arrangements (as would be apparent to a person skilled in the art). Therefore, the scope of the appended claims should be accorded the broadest interpretation so as to encompass all such modifications and similar arrangements.

What is claimed is:

1. A circuit board device for reducing acoustic noise, comprising:
    a substrate;
    a first capacitor packaging area and a second capacitor packaging area, in a back-to-back manner, disposed on a first side and a second side of the substrate respectively;
    a first pad and a second pad disposed in the first capacitor packaging area for mounting a first capacitor;
    a third pad and a fourth pad disposed in the second capacitor packaging area for mounting a second capacitor; and
    an opening, setting between the first, second, third and fourth pads and passing through the first and second capacitor packaging areas, wherein the first and third pads are set back-to-back and electrically connected to each other; and
    wherein the second and fourth pads are set back-to-back and electrically connected to each other.

2. The circuit board device of claim 1, wherein the first and second capacitors are multilayer ceramic capacitors (MLCC).

3. The circuit board device of claim 1, wherein the size and capacitance of the first capacitor are the same as the size and capacitance of the second capacitor.

4. A circuit device for reducing acoustic noise, comprising:
    a first capacitor ;
    a second capacitor;
    a circuit board device, comprising:
        a substrate;
        a first capacitor packaging area and a second capacitor packaging area, in a back-to-back manner, disposed on a first side and a second side of the substrate respectively;
        a first pad and a second pad disposed in the first capacitor packaging area for mounting a first capacitor; and
        a third pad and a fourth pad disposed in the second capacitor packaging area for mounting a second capacitor; and
        an opening, setting between first, second, third and fourth pads, and passing through the first and second capacitor packaging areas, wherein the first and third pads are set back-to-back and electrically connected to each other and the second and fourth pads are set back-to-back and electrically connected to each other;
    a driving circuit disposed on the circuit board device;
    a load circuit disposed on the circuit board device; and
    a conduction path coupled to the driving circuit and the load circuit and electrically connected to the first and third pads.

5. The circuit device of claim 4, wherein the first and second capacitors are multilayer ceramic capacitors (MLCC).

6. The circuit device of claim 4, wherein the size and capacitance of the first capacitor are the same as the size and capacitance of the second capacitor.

* * * * *